United States Patent [19]

Masleid et al.

[11] Patent Number: 5,036,215
[45] Date of Patent: Jul. 30, 1991

[54] PASS GATE MULTIPLEXER RECEIVER CIRCUIT

[75] Inventors: Robert P. Masleid; Robert F. Sechler, both of Austin, Tex.

[73] Assignee: International Business Machines Corporation, Armonk, N.Y.

[21] Appl. No.: 471,893

[22] Filed: Jan. 29, 1990

[51] Int. Cl.$^5$ .................. H03K 17/16; H03K 17/687; H03K 17/08; H03K 3/073

[52] U.S. Cl. .................................. 307/243; 307/443; 307/448; 307/446; 307/570; 307/585; 307/482.1; 307/303.2; 357/23.13; 357/43

[58] Field of Search .............. 307/448, 450, 451, 452, 307/453, 446, 482.1, 303.2, 571, 584, 585, 576, 579, 270, 279, 443, 243, 242; 357/23.13, 43

[56] References Cited

U.S. PATENT DOCUMENTS

| | | | |
|---|---|---|---|
| 4,286,173 | 8/1981 | Oka et al. | 307/242 X |
| 4,710,649 | 12/1987 | Lewis | 307/585 X |
| 4,755,696 | 7/1988 | Pickett | 307/451 |
| 4,812,678 | 3/1989 | Abe | 307/443 |
| 4,857,773 | 8/1989 | Takata et al. | 307/443 X |
| 4,893,031 | 1/1990 | Masuda | 307/451 |

OTHER PUBLICATIONS

IBM Technical Disclosure Bulletin, vol. 19, No. 5, Oct. 1976, pp. 1829-1830, entitled "FET Signal Receiver for VTL Circuits".
IBM Technical Disclosure Bulletin, vol. 29, No. 12, May 1987, p. 5167, entitled "Fast Level Convertor Circuit".
IBM Technical Disclosure Bulletin, vol. 28, No. 8, Jan. 1986, pp. 3448-3449, entitled "General Purpose Interface Receiver Using Short Channel CMOS Devices".
IBM Technical Disclosure Bulletin, vol. 28, No. 9, Feb. 1986, pp. 4035-4037, entitled "Medium-Power, Minimal-Area Clamping Circuits for Bipolar Application".
IBM Technical Disclosure Bulletin, vol. 31, No. 2, Jul. 1988, pp. 474-475, entitled "High-Speed ECL BIFET Receiver for High-End System".
IBM Technical Disclosure Bulletin, vol. 16, No. 5, Oct. 1973, p. 1637, entitled "Low-Power Gated Receiver".
IBM Technical Disclosure Bulletin, vol. 31, No. 2, Jul. 1988, pp. 392-393, entitled "High Performance Off-Chip Common I/O Circuit".
IBM Technical Disclosure Bulletin, vol. 23, No. 3, Aug. 1980, p. 1052, entitled "Electrostatic Discharge Protection Device for Current Switch Receivers".
IBM Technical Disclosure Bulletin, vol. 26, No. 7A, Dec. 1983, pp. 3122-3123, entitled "ESD-Protected TTL Receiver for FET Products".
IBM Technical Technical Disclosure Bulletin, vol. 23, No. 4, Sep. 1980, pp. 1442-1443, entitled "Multiple I/O Protection With Single Protective Device".
IBM Technical Disclosure Bulletin, vol. 20, No. 12, May 1978, pp. 5192-5193, entitled "Low-Power Dissipation Push-Pull Driver".
IBM Technical Disclosure Bulletin, vol. 25, No. 3A, Aug. 1982, pp. 993-994, entitled "Low Voltage Inverter Receiver Circuit".

Primary Examiner—Stanley D. Miller
Assistant Examiner—David R. Bertelson
Attorney, Agent, or Firm—Thomas E. Tyson

[57] ABSTRACT

A pass gate multiplexer receiver integrated circuit on a semiconductor substrate including a pass gate circuit including first and second field effect transistors of opposite polarity for providing an input signal to an output line, the first transistor including a first bipolar transistor for providing clamping an electrostatic discharge protection and the second transistor including a second bipolar transistor for providing clamping and electrostatic discharge protection. A control circuit is connected to the pass gate to control operation. In a second embodiment the pass gate further includes a clamping circuit to provide further clamping and electrostatic discharge protection.

18 Claims, 4 Drawing Sheets

PASS GATE MULTIPLEXER RECEIVER CIRCUIT

CROSS REFERENCE TO RELATED PATENT APPLICATION

This application is related to copending U.S. patent application Ser. No. 07/471,892 filed Jan. 29, 1990.

TECHNICAL FIELD

This invention relates to electronic circuits and, more specifically, to an integrated pass gate multiplexer receiving circuit.

BACKGROUND ART

An integrated circuit receiver is exposed to a external signals. Therefore, in order to protect it and other circuits contained on the integrated circuit device, several functions must be provided. These include electrostatic discharge protection, transmission line signal clamping and latch-up protection. Additionally, a receiver is required to provide adequate drive for an on-chip load. Also, in certain instances, a boundary scan multiplexing capability is provided for test. Conventionally, these functions have been implemented with several different, separate structures. For example, electrostatic discharge protection may be provided by specialized avalanche breakdown devices. Transmission line signal clamping might be handled with off-chip resistors. Latch-up protection and adequate drive for the on-chip load have been implemented with a large buffer with field effect transistor gate inputs (the gate oxide prevents excessive off-chip voltages from reaching the chip diffusion). Boundary scan multiplexing (the ability to switch off an input away from the input pin in order to test the latch within the chip) has been left for the internal chip logic designer to incorporate.

The following prior art illustrates pass gate or transfer gate receiving circuits. *IBM Technical Disclosure Bulletin*, Vol. 19, No. 5, Oct. 1976, entitled "FET Signal Receiver for TTL Circuits" illustrates a simple pass gate circuit of the prior art.

*IBM Technical Disclosure Bulletin*, Vol. 29, No. 12, May, 1987, entitled "Fast Level Convertor Circuit" illustrates a pass gate connected to a buffer, which is the conventional method for providing load driving capabilities.

*IBM Technical Disclosure Bulletin*, Vol. 28, No. 8, Jan., 1986, entitled "General Purpose Interface Receiver Using Short Channel CMOS Devices" illustrates a CMOS receiver circuit.

*IBM Technical Disclosure Bulletin*, Vol. 28, No. 9, Feb., 1986, entitled "Medium Power, Minimum-Area Clamping Circuits for Bipolar Applications" illustrates a clamping circuit.

*IBM Technical Disclosure Bulletin*, Vol. 31, No. 2, July, 1988, entitled "High Speed ECL BIFET Receiver for High End Systems" also illustrates a receiver circuit.

*IBM Technical Disclosure Bulletin*, Vol. 16, No. 5, Oct., 1973, entitled "Low Power Gated Receiver" also illustrates a CMOS receiver circuit.

*IBM Technical Disclosure Bulletin*, Vol. 31, No. 2, July, 1988, entitled "High Performance Off-Chip Common I/O Circuit" discloses, in functional form, an input/output circuit with separate functional modules indicating separate functional components.

Electrostatic discharge protection is shown in several references. The first is *IBM Technical Disclosure Bulletin*, Vol. 23, No. 3, Aug., 1980, entitled "Electrostatic Discharge Protection Device for Current Switch Receivers" which shows the use of an electrostatic discharge diode.

*IBM Technical Disclosure Bulletin*, Vol. 26, No. 7A, Dec., 1983, entitled "ESD-Protected TTL Receiver for FET Products" illustrates a non-integrated approach for providing electrostatic discharge protection.

*IBM Technical Disclosure Bulletin*, Vol. 23, No. 4, Sept., 1980, entitled "Multiple I/O Protection With Single Protective Device" discloses a single protected device that is connected across several inputs for a receiver.

*IBM Technical Disclosure Bulletin*, Vol. 20, No. 12, May, 1978, entitled "Low-Powered Dissipation Push-Pull Driver" illustrates a receiver that includes clamping protection in the forum of an active terminator.

*IBM Technical Disclosure Bulletin*, Vol. 25, No. 3A, Aug., 1982, entitled "Low Voltage Invertor Receiver Circuit" illustrates an invertor receiver circuit that includes an ESD function, a clamping circuit and a receiving circuit. However, these functions are accomplished by separate elements of the same function.

It is an object of the present invention to provide a pass gate multiplexer receiver circuit that is integrated, in that the components within the pass gate circuit provide several of the functions, such as electronic discharge protection and transmission line signal clamping.

DISCLOSURE OF THE INVENTION

In accordance with the present invention a pass gate multiplexer receiver integrated circuit is provided. The receiver circuit is fabricated on a single semiconductor substrate and includes a pass gate circuit. The pass gate circuit includes first and second field effect transistors of opposite polarity for providing an input signal to an output line. The first field effect transistor includes a first bipolar transistor that provides signal clamping and electrostatic discharge protection. The second field effect transistor also includes a second bipolar transistor for providing clamping and electrostatic discharge protection. The receiver circuit further includes a control circuit that controls the operation of the pass gate circuit.

In the preferred embodiment the pass gate portion consists of two field effect transistors of opposite polarity. These field effect transistors are fabricated such that they both include bipolar transistors. The P channel PNP bipolar transistor includes a interconnection between the source of the P+ channel transistor, an N− N-well substrate region and then P substrate region of the semiconductor device. In the preferred embodiment the P substrate region provides a low resistance connection to a ground potential. The bipolar transistor for the N channel device is between the N+ region of the drain and the surrounding P epitaxy region together with the N region return to Vdd. In the preferred embodiment the N region of the drain and the N region return to Vdd are fabricated in close proximity in order to increase the operability of the second bipolar transistor.

In the second preferred embodiment the pass gate circuit includes an input clamp circuit. The input clamp circuit provides two bipolar transistors. The second bipolar transistor is between an N region connected to the input line, the P epitaxy region and the N region returned to Vdd. Again the N region connected to the input line and the N region returned to Vdd are positioned in close proximity to maximize the operability of the first bipolar transistor. The first bipolar transistor is fabricated between the P region that is connected to the input line, an N well region surrounding the P region and the P substrate region or an additional P region adjacent to the first P region. The P substrate region is fabricated to provide a low resistance connection to a ground potential.

It is seen from the second embodiment described above that the complementary bipolar clamps are inherent to complementary MOS (CMOS) devices. What is required is design and biasing of the devices to achieve the desired input signal clamping without compromising other electrical operation. These requirements will be described.

BRIEF DESCRIPTION OF THE DRAWING

The foregoing and other objects, aspects and advantages of the invention will be better understood from the following detailed description of the Best Mode for Carrying Out the Invention with reference to the figures listed below, in which.

BEST MODE FOR CARRYING OUT THE INVENTION

This invention provides in a single integrated compact circuit, electrostatic discharge protection, transmission line signal clamping, latch-up protection, adequate drive for on-chip load and boundary scan multiplexing for testing. These features are implemented in a pass gate multiplexer receiver circuit. The electrostatic discharge protection, transmission line signal clamping, and latch-up protection are all provided by parasitic bipolar transistors of the complementary pass gate devices and its guard rings. Adequate drive is provided by the off-chip source through the rather low impedance of the large pass gate devices. The boundary scan multiplexing function is provided by turning off the pass gate transistors and activating a small, on-chip tristate buffer fed by the boundary scan test latch.

Figure 1:
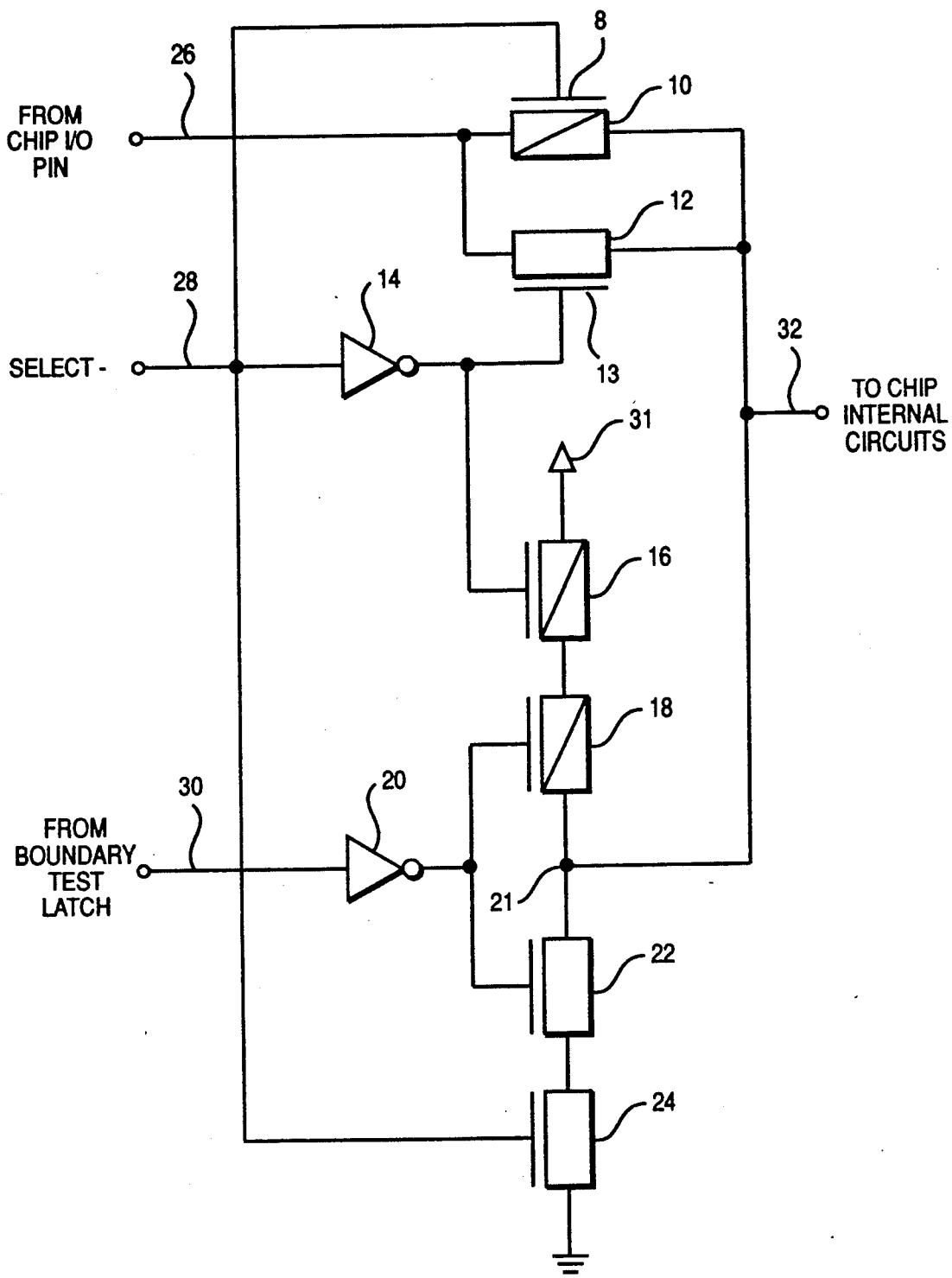
FIG. 1 is a schematic diagram of the first embodiment of the invention.

FIG. 1 is a schematic diagram for the pass gate multiplexer receiver circuit. In the preferred embodiment, the pass gate portion, including devices 10 and 12, is made relatively large to provide both the high performance path from off-chip signal sources, as well as a large area to provide electrostatic discharge protection and over shoot energy absorption. The parasitic capacitance of the pass gate devices is unimportant because these devices are driven by an off-chip source which is required to drive much larger capacitance than that due to these devices. The pass gate devices are laid out or fabricated according to standard anti-latch-up practices. Externally connected P and N diffusion must be widely separated from everything and each other. Otherwise, obey: N diffusion connected to a chip pad should be protected by an N-well ring connected to Vdd that surrounds but does not touch the N diffusion. P diffusion connected to a chip pad should be protected by an N+ diffusion ring connected to Vdd that surrounds the P diffusion. The N+ ring must lie in the same N-well as the P diffusion. P diffusion should also be protected by N diffusion. Coincidentally, these practices also provide bipolar transistors (to be discussed relative to FIG. 2) to Vdd via the guard ring and to ground via the substrate. These bipolar transistors act as clamps for the electrostatic discharge pulses of either polarity as well as the transmission line signal clamping.

A principal draw back to this present approach is that the parasitic bipolar transistor effects allow off-chip signal over shoots to propagate through the pass gate devices when the devices are turned off. Over shoots below ground activate the NPN transistor across the N channel FET pass gate device. Over shoots above the chip Vdd activate the PNP transistor across the P channel FET pass gate device. The unwanted propagation can create logic errors on the multiplexer output. In addition, the current flow during under shoot may incite further bipolar action in pass gate circuit driven by the receiver. These problems may be alleviated by design restrictions or supplemental clamps. The restriction approach forbids switching off-chip signals during chip internal testing, using the pass gate receiver as a functional mode multiplexer, or driving pass gates with the pass gate receiver. The supplemental clamp approach will be discussed later.

In FIG. 1, the input signal is provided on line 26 to the pass gate devices 10 and 12 that include the pass gate device gates 8 and 13, respectively. In this embodiment, device 10 is a P channel and device 12 is an N channel device. The select signal is provided on line 28, which is coupled directly to the device 10 gate 8 and through invertor 14 to the device 12 gate 13. The output of devices 10 and 12 are provided to line 32.

A test input may be provided on line 30. The signal on line 30 is input through invertor 20 to the gates of devices 18 and 22 which either provide a path from Vdd 31 to line 32 or from ground to line 32 through devices 18 and 22, respectively. It should be noted that when the select line 28 is active, that the select line provides an input to the gate of device 24 and an input through invertor 14 to device 16 to isolate node 21 from Vdd 31 and ground.

Figure 2:
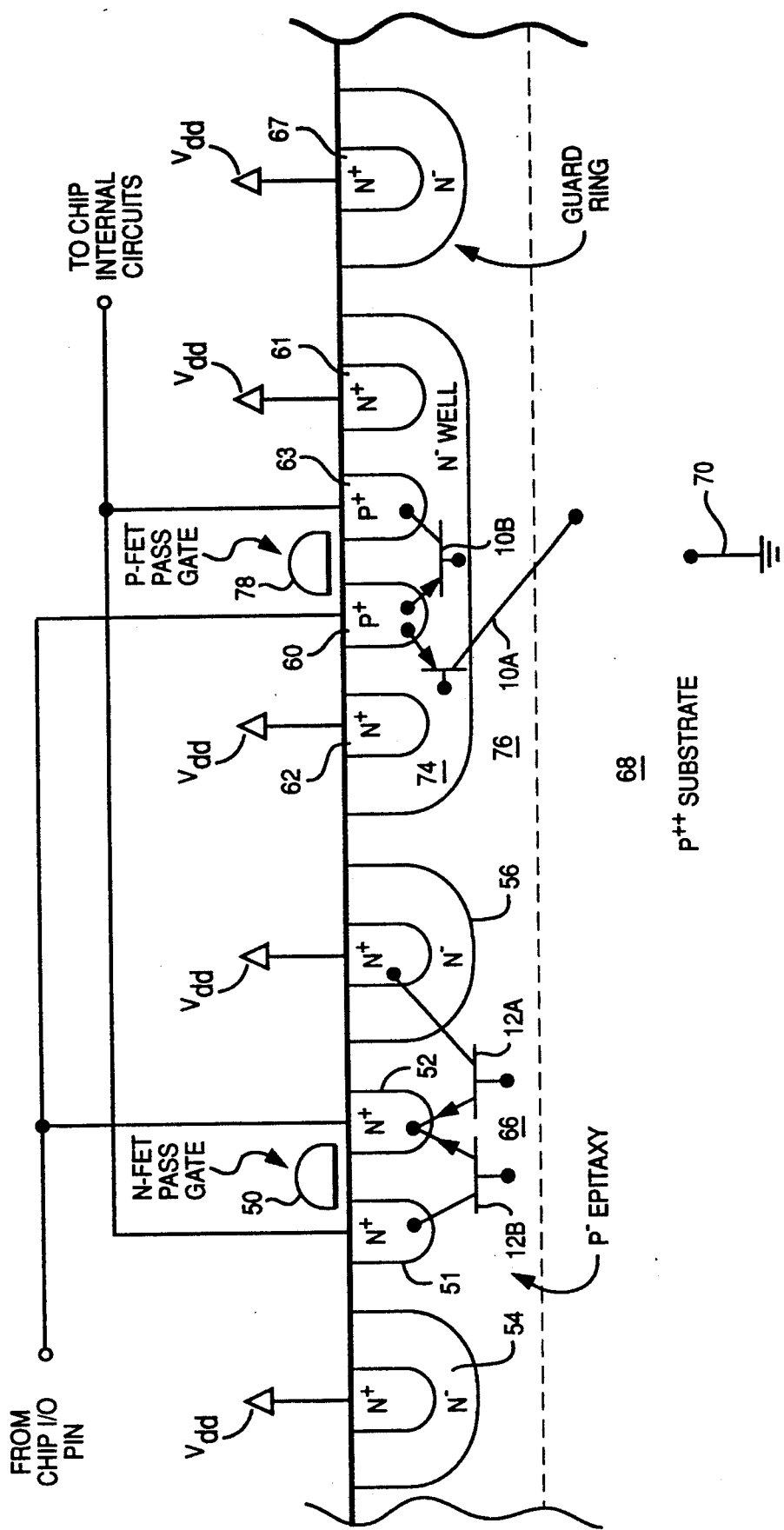
FIG. 2 is a sectional diagram of an integrated circuit portion of the pass gate transistors illustrated in FIG. 1.

FIG. 2 is a cross sectional area of the pass gate devices 10 and 12 of FIG. 1. In FIG. 2, the P channel device 10 includes a gate 78 positioned over two regions, 60 and 63, respectively. This P channel device 10 is surrounded by guard rings 61 and 62. The guard ring, including regions 61 and 62 and the source and drain, 60 and 63, of the P channel device 10 are positioned in a N region 74. The N channel device 12 includes a gate 50 positioned above the source and drain regions 51 and 52 to make up the device. The N channel device 12 is surrounded by guard rings 54 and 56. A further guard ring, 67, is located on the opposite side of the P channel device 10. In fact, guard rings 67, 56 and 54 are all the same part of a single guard ring that, in a view above the chip, would resemble a figure "8".

Guard rings 54 and 56 for the N channel device 12 and guard rings 61, 62, 56 and 57 for the P channel device 10 provide latch-up protection. The fabrication of the N channel device 12 will result in two parasitic bipolar transistors illustrated as 12A and 12B being produced. The parasitic bipolar transistor 12B consists of emitter region 52, collector region 51 and the base region 66, which is the P epitaxy region. This parasitic bipolar transistor 12B results from the fabrication of the N channel device 12. A second parasitic bipolar transistor 12A results from the location of the emitter 52 relative to the guard ring 56. The guard ring 56 will serve as the collector and the P epitaxy region 66 will form the base. In the preferred embodiment, it is recommended that the N region 52 be placed as close as possible to the guard ring region 56. This parasitic bipolar transistor 12A provides clamping and, further, provides significant electrostatic discharge protection.

In the P channel device 10, two similar parasitic bipolar transistors are also produced. The first is illustrated as transistor 10A having an collector in the P substrate region 68, a base in the N region 74 and the collector in the P region 60. Transistor 10A corresponds to transistor 12A of the N channel device 12. In other words, the parasitic bipolar transistor 10A provides clamping and also significant electrostatic discharge. To enhance the electrostatic discharge protection, in the preferred embodiment the resistance between the P substrate region 68 and the ground 70 is made as small as possible. The second parasitic bipolar transistor 10B is similar to the transistor 12B. It consists of a collector region 63, a base region 74 (being the N well region) and the collector region 60, as shown. Again, like the parasitic bipolar transistor 12B, this is an undesirable parasitic transistor that results from the fabrication of the P channel field effect transistor 10.

It should be clearly understood by those skilled in the art that the recommendations of the placement of the N channel device close to the guard ring and the reduction of the resistance between the P substrate 68 and the ground 70 enhance the clamping and electrostatic discharge capability of these two devices. Therefore, additional devices to provide these functions (clamping and electrostatic discharge protection) are not required. This results in an obvious space savings for layout of the circuit.

In summary, the physical design of the bipolar transistors inherent to the CMOS structure is optimized to minimize base width and distance from base contact. The combination enhances clamping and ESD action by maximizing transistor gain and minimizing base resistance.

One principle draw back of the embodiment in FIG. 2 is that the parasitic bipolar transistor effects allow off-chip signal over shoots to propagate through the pass gate devices even when the circuit is turned off. Over shoots below ground activate the parasitic bipolar capacitor 12B across the N channel device 12. Over shoots above the chip voltage Vdd activate the parasitic bipolar transistor 10B across the P channel device 10. This unwarranted propagation may create logic errors on the multiplexer circuit output. In addition, the current flowing during the over shoot may incite further bipolar action in a pass gate circuit driven by the receiver.

Figure 3:
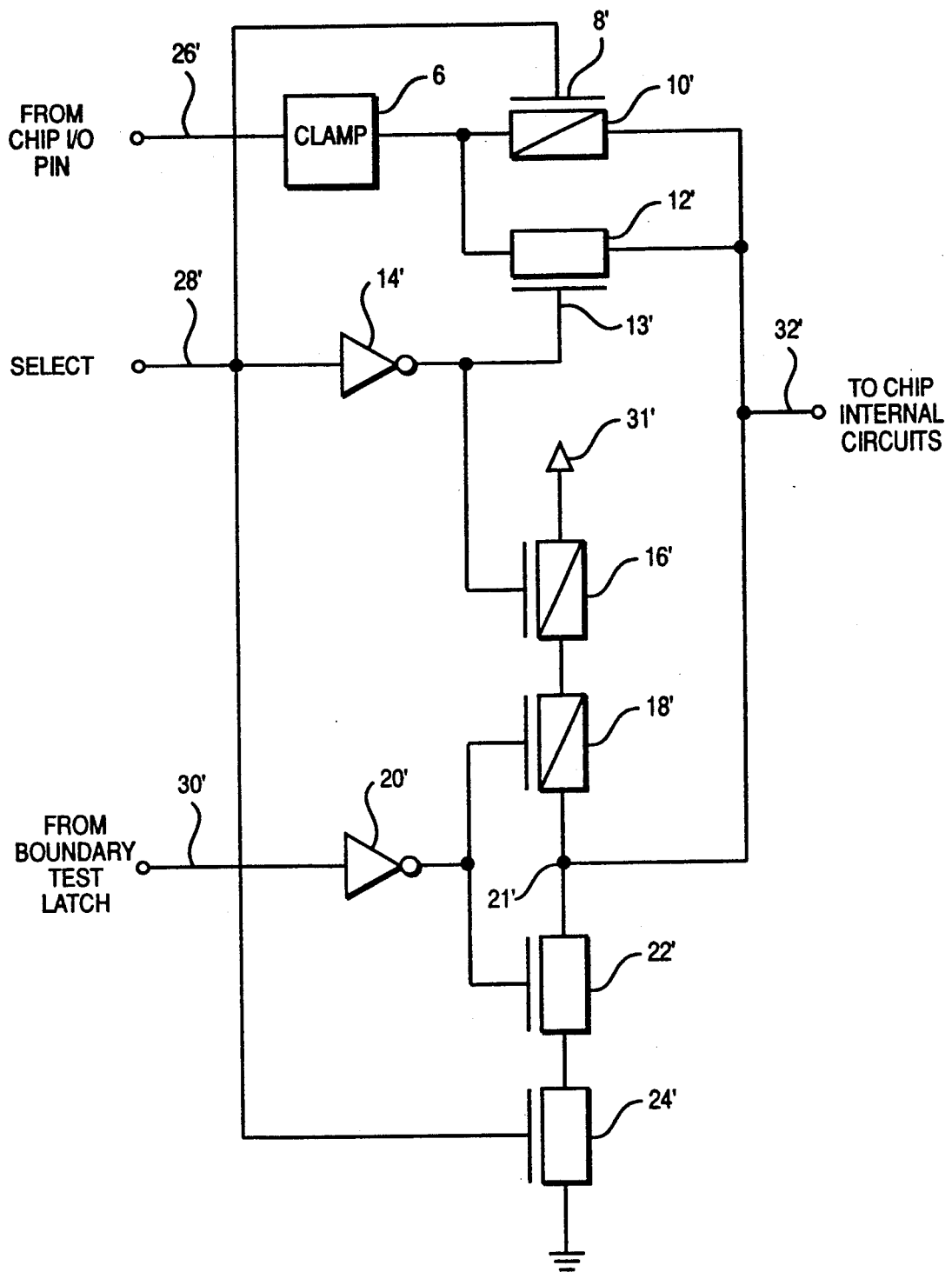
FIG. 3 is a schematic diagram of a second embodiment of the invention including a clamping circuit located before the pass gate transistors.

These problems can be solved by the circuit shown in FIG. 3. The circuit in FIG. 3 is identical to the circuit in FIG. 1 with the exception that an additional clamping circuit 6 has been added as an input to the two pass gate devices, 10 prime and 12 prime. Additionally, in the preferred embodiment design restrictions are recommended. This design restriction approach forbids switching off-chip signals during chip internal testing and using the pass gate receiver as a functional mode multiplexer. The supplemental clamp 6 is illustrated in cross section form in FIG. 4. The structures illustrated in FIG. 4 create additional parasitic bipolar transistors like the receiver clamp transistors 12A and 10A in order to provide sufficient current shunt to avoid the over shoot propagation problems previously discussed.

Figure 4:
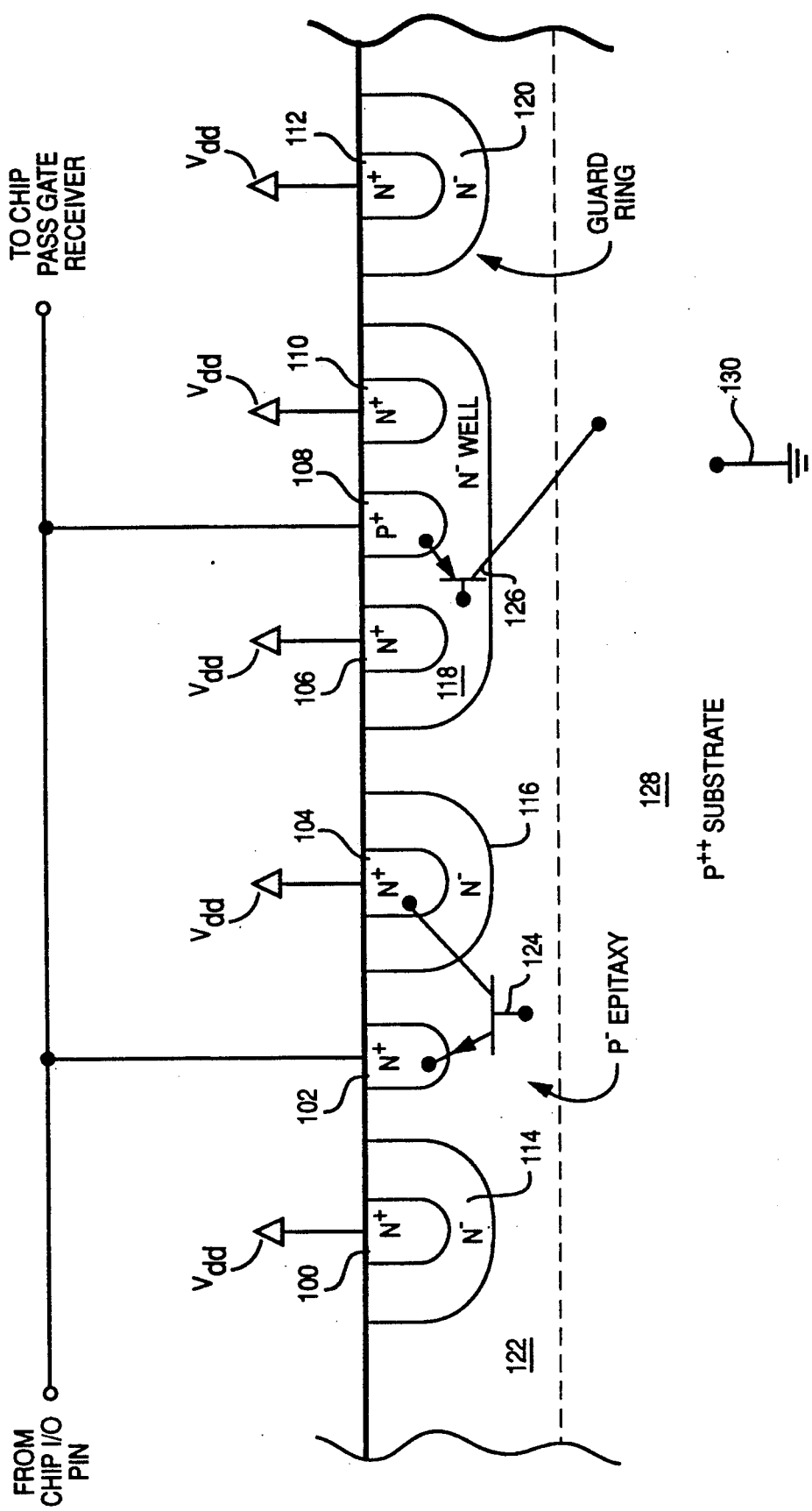
FIG. 4 is a sectional view an integrated circuit illustrating the fabrication of the clamping devices illustrated in FIG. 3.

Referring to FIG. 4, one transistor 124 consists of an collector in the N region 104 of the guard ring with the base region being the P epitaxy region 122 and the emitter region being the N region 102. The second transistor 126 consists of the collector in the P substrate region 128, the base region being the N region 118 connected to the emitter P region 108, as shown. Note that the N region 102, together with the surrounding guard rings 100 and 104 form a clamp. Likewise, the P region 108 forms a clamp with the N region 118 and epitaxy 122 and is surrounded by a guard ring, illustrated as 106 and 110 and 104 and 112. As in FIG. 2, the region 112 is a part of the same guard ring as including as regions 100 and 104. By providing these two clamps of opposite polarities as clamps across the input of the pass gate devices, over shoot propagation problems will be avoided.

Further, in the preferred embodiment the wiring resistance between the chip I/O on line 26 and the first clamp, whether it be transistors 12B and 10B or the clamps consisting of regions 102 and 108 in FIG. 4, this resistance must be kept low enough as to not interfere with transmission line signal clamping.

Boundary scan multiplexing is achieved simply by setting the select line (28 of FIG. 1) to "1". The chip input 26 is then isolated from the chip internal circuits 32 which are instead connected to 30, the boundary test latch.

Adequate drive for on-chip load is obtained by selecting the total width of FET's 10 and 12 (FIG. 1). Considerable latitude is available here. Approximately 10× the size of a normal on-chip circuit (for CMOS of about 0,99 channel length) provides both good drive and sufficient bulk of diffusion to absorb ESD and over shoot energy. Even at this size receiver area is contained to 1% of the total chip. Parasitic loading on the off-chip net is still modest, too.

ESD requirements for diffusion bulk are met in satisfying the drive requirements. The metal and contacts of the chip input 26 (FIG. 1) must have sufficient cross-section and area per the usual art to withstand ESD surges. The robust wires are also required by the low impedance needed for successful transmission line clamping per the usual art.

While the invention has been described with reference to the illustrated embodiment, this description is not intended to be construed in a limiting sense. Various modifications of the illustrated embodiment as well as other embodiments of the invention will become apparent to those persons skilled in the art upon reference to this description. It is, therefore, contemplated that these appended claims will cover any such modifications or embodiments as fall within the true scope of this invention.

We claim:

1. A pass gate multiplexer receiver integrated circuit on a semiconductor substrate comprising:
   a pass gate means including first and second field effect transistors of opposite polarity for providing an input signal to an output line, said first transistor including a first bipolar transistor means for providing clamping and electrostatic discharge protection and including a guard ring region and said second transistor including a second bipolar transistor means for providing clamping and electrostatic discharge protection; and a control means for controlling pass gate means operation.

2. A pass gate multiplexer receiver integrated circuit of claim 1 further including a test means for providing a predetermined voltage on said output line and said control means includes means for switching said output line between the pass gate means and the test means.

3. A pass gate multiplexer receiver integrated circuit of claim 1 wherein said first bipolar transistor means includes a first field effect transistor region, a first substrate region and a first guard ring region.

4. A pass gate multiplexer receiver integrated circuit of claim 1 wherein said second bipolar transistor means includes a second field effect transistor region, a second substrate region and a third substrate region.

5. A pass gate multiplexer receiver integrated circuit of claim 4 wherein third substrate region is fabricated to provide a low resistance connection to a ground potential.

6. A pass gate multiplexer receiver integrated circuit of claim 1 wherein said pass gate means includes a clamp means connected to the input of pass gate means for providing latch-up protection.

7. A pass gate multiplexer receiver integrated circuit of claim 6 wherein said clamp means includes third and fourth bipolar transistors.

8. A pass gate multiplexer receiver integrated circuit of claim 7 wherein said third bipolar transistor includes a fourth substrate region, said second substrate region and a second guard ring.

9. A pass gate multiplexer receiver integrated circuit of claim 7 wherein said fourth bipolar transistor includes a fifth substrate region, a sixth substrate region and said third substrate region.

10. A pass gate multiplexer receiver integrated circuit on a semiconductor substrate comprising:

a pass gate means including a first p channel field effect transistor and a first n channel field effect transistor for providing an input signal to an output line, said first p channel transistor including a first bipolar transistor means for providing clamping and electrostatic discharge protection and including a guard ring region and said first n channel transistor including a second bipolar transistor means for providing clamping and electrostatic discharge protection; and a control means for controlling pass gate means operation and connected to a gate of the first p channel transistor and connected through an inverter to a gate of said first n channel transistor.

11. A pass gate multiplexer receiver integrated circuit of claim 10 further including a test means for providing a predetermined voltage on said output line, said test means including a test input line to receive a test input signal, said test input line connected through a second inverter to a gate of a second p channel field effect transistor and a gate of a second n channel field effect transistor, said second p channel and n channel transistors connected to said output line, and said control means includes means for switching said output line between the pass gate means and the test means, said switching means including a third p channel transistor having a gate connected to said first inverter and connected between a voltage potential and said second p channel transistor and a third n channel transistor having a gate connected to a control input line and connected between a ground potential and said second n channel transistor.

12. A pass gate multiplexer receiver integrated circuit of claim 10 wherein said first bipolar transistor means includes a first field effect transistor region, a first substrate region and a first guard ring region, said first field effect transistor region located in close proximity to said guard ring region.

13. A pass gate multiplexer receiver integrated circuit of claim 10 wherein said second bipolar transistor means includes a second field effect transistor region, a second substrate region and a third substrate region.

14. A pass gate multiplexer receiver integrated circuit of claim 13 wherein third substrate region is fabricated to provide a low resistance connection to a ground potential.

15. A pass gate multiplexer receiver integrated circuit of claim 10 wherein said pass gate means includes a clamp means connected to the input of pass gate means for providing latch-up protection.

16. A pass gate multiplexer receiver integrated circuit of claim 15 wherein said clamp means includes third and fourth bipolar transistors.

17. A pass gate multiplexer receiver integrated circuit of claim 16 wherein said third bipolar transistor includes a fourth substrate region, said second substrate region and a second guard ring.

18. A pass gate multiplexer receiver integrated circuit of claim 16 wherein said fourth bipolar transistor includes a fifth substrate region, a sixth substrate region and said third substrate region.

* * * * *